United States Patent [19]

Matzuzawa et al.

[11] Patent Number: 4,599,602
[45] Date of Patent: Jul. 8, 1986

[54] SERIAL-TYPE A/D CONVERTER UTILIZING FOLDING CIRCUIT CELLS

[75] Inventors: Akira Matzuzawa, Neyagawa; Michihiro Inoue, Ikoma, both of Japan

[73] Assignee: Matsushita Electric Industrial Co., Ltd., Osaka, Japan

[21] Appl. No.: 636,410

[22] Filed: Jul. 31, 1984

[30] Foreign Application Priority Data

Aug. 3, 1983 [JP] Japan .................................. 58-143018
Oct. 7, 1983 [JP] Japan .................................. 58-186688
Dec. 15, 1983 [JP] Japan .................................. 58-236660

[51] Int. Cl.⁴ .............................................. H03M 1/12
[52] U.S. Cl. ........................ 340/347 AD; 340/347 M; 340/347 P
[58] Field of Search ................................. 340/347 AD

[56] References Cited

U.S. PATENT DOCUMENTS 3,161,868 12/1964 Waldhauer .................. 340/347 AD
3,187,325 6/1965 Waldhauer .................. 340/347 AD
4,325,054 4/1982 van de Plassche .......... 340/347 AD Primary Examiner—William M. Shoop, Jr.
Assistant Examiner—Saul M. Bergmann
Attorney, Agent, or Firm—Spencer & Frank

[57] ABSTRACT

In a serial-type A/D converter utilizing folding circuit cells connected in cascade, the cell has a differential type input and a differential type output, and a comparator included in the cell switches over current paths in the cell to establish a folding characteristic. An input potential difference is converted into a current difference by a pair of transistors having the emitters interconnected through a resistor, and the current difference is further converted into a pair of differential output voltages by a load circuit having a pair of series connections each including a resistor, a diode and a transistor having its base connected with another resistor, so that the non-linear characteristic and gain can be corrected. A current switching circuit is switched by the comparator for discriminating the polarity of the input potential difference to switch over current paths for the paired transistors or to alternately operate voltage level shifting circuits associated with a pair of output terminals, thereby establishing the folding characteristic with high accuracy.

13 Claims, 15 Drawing Figures

SERIAL-TYPE A/D CONVERTER UTILIZING FOLDING CIRCUIT CELLS

BACKGROUND OF THE INVENTION

This invention relates to a serial-type A/D converter comprising folding circuit cells connected in cascade.

Various types of A/D converter for conversion of analog values into digital values are available of which one is the serial-type A/D converter. Especially, a serial-type A/D converter adapted for the A/D conversion into a Gray code has folding circuit cells connected in cascade as shown in FIG. 2, each cell having an input/output characteristic as graphically shown in FIG. 1. The input/output characteristic, depicted as a solid curve in FIG. 1, is obtained by selecting higher level portions from output waveforms, complementary to each other, of a differential amplifier which exhibits linear output characteristics with respect to input signals. The thus obtained folding circuit cell has a minimum output level at an input threshold voltage $V_{TH1}$. The output of this cell a is then inputted to a cell of subsequent stage having a preset input threshold voltage $V_{TH2}$, so that the initial input signal can be folded gradually. In FIG. 2, reference numeral 1 designates an analog signal, 2A to 2C folding circuit cells, 3 a threshold voltage, 4A to 4D comparators, and 5A to 5D converter output terminals. The analog signal 1 is folded each time it passes through each cell thereby producing a voltage having a polarity relative to that of the threshold voltage which is determined by the signal at the input point of each cell. Thus, the signal is compared with the threshold voltage at the respective comparators 4A to 4D at the input point of each cell to provide converted outputs at the respective output terminals 5A to 5D.

In the serial-type A/D converter as described above, each of the folding circuit cells is required to have sufficiently accurate gain, offset voltage, linearity and threshold voltage.

A prior art circuit which can be used as the folding circuit cell 2A, 2B, . . . , or 2C is exemplified in FIG. 3. The circuit comprises an input terminal 6, a terminal 7 applied with a threshold voltage from a source 2, transistors 8A and 8B constituting a differential amplifier, constant current sources 9A and 9B, a resistor 10 for linear conversion of the input voltage, load resistors 11A and 11B, transistors 12A and 12B for production of the folded characteristic, a current source 13, an output terminal 14, and a power supply 15. When the voltage between the terminal 6 and 7 is $V_i$, currents in the current sources 9A and 9B are $I_s$, the resistor 10 has a resistance of $R_d$, the current flowing through the resistor 10 is $I_d$, the load resistors 11A and 11B have a resistance of $R_L$, and the output voltage is $V_L$, the differential input voltage $V_i$ is given by $$V_i = R_d I_d + V_T \ln\left(\frac{I_s + I_d}{I_s - I_d}\right) \tag{1}$$

where $$V_T = \frac{KT}{q},$$

k is Boltzmann's constant, T is temperature and q is the magnitude of the electronic charge; and the output voltage is given by $$V_L = \alpha \cdot R_L (I_s + I_d) \tag{2}$$

where $\alpha$ is the grounded base current amplification factor of the transistors 8A and 8B. However, since $R_L \cdot I_s$ does not vary to act as a bias component in the output voltage $V_L$, assuming that the output voltage obtained by subtracting $R_L \cdot I_s$ from the output voltage $V_L$ is $V_L'$, $$V_L' = \alpha \cdot R_L I_d \tag{2'}$$

If the condition, $$V_T \ln\left(\frac{I_s + I_d}{I_s - I_d}\right) << R_d \cdot I_d,$$

is valid there results a gain K which is expressed as $$K = \alpha \cdot \frac{V_L'}{V_i} \approx \alpha \cdot \frac{R_L}{R_d}. \tag{3}$$

Incidentally, in order to attain high resolution of the serial-type A/D converter, as shown in FIG. 2, K=2 must be satisfied. To this end, $\alpha \cdot R_L = 2R_d$ is needed but this matching condition is difficult to achieve because of the difference in resistance between the load resistor 11A or 11B and the linear conversion resistor 10. Further variations in the current amplification factor $\alpha$ are large making it difficult to make $\alpha$ a constant.

In addition, in order for the condition, $$V_T \ln\left(\frac{I_s + I_d}{I_s - I_d}\right) << R_d \cdot I_d,$$

to be satisfied, $I_d << I_s$ must be met and at the same time, $R_d$ must be increased, followed by an increased $R_L$ and consequently an increased $R_L \cdot I_s$ which disadvantageously reduces utilization efficiency of the output voltage.

In addition to the above disadvantages, there occurs an error at the folding portion with the prior art folding circuit cell. More specifically, when the output potential difference between the load resistors 11A and 11B is $\Delta V$, an error voltage $\epsilon(V)$ in the output voltage appearing at the output terminal 14 is written as $$\epsilon = V_T \ln\left[\frac{\exp\frac{\Delta V}{\Delta T}}{1 + \exp\frac{\Delta V}{\Delta T}}\right] \tag{4}$$

where $$V_T = \frac{KT}{q}.$$

From equation (4), there result $$\epsilon \approx 0 \text{ for } \Delta V \gg V_T \qquad (5A)$$

$$\epsilon = V_T \cdot \ln[\tfrac{1}{2}] \text{ for } \Delta V = 0. \qquad (5B)$$

Equations (5A) and (5B) indicate that, at room temperature, the error voltage at the folding portion becomes about 18 mV which cannot be negligible when constructing the serial-type A/D converter with a resolution of 5 bits or less.

Accordingly, the prior art serial-type A/D converter is partly advantageous in that its construction is simple and can be materialized on a relatively small scale, but the A/D converter is partly disadvantageous in that its resolution is of 5 to 6 bits at the most for the reasons described above, thus preventing highly accurate A/D conversion.

SUMMARY OF THE INVENTION

A first object of this invention is to provide a serial-type A/D converter utilizing highly accurate folding circuit cells.

A second object of this invention is to provide a serial-type A/D converter utilizing folding circuit cells which are easy to integrate.

A third object of this invention is to provide a serial-type A/D converter utilizing folding circuit cells which can convert an output code to another at a high conversion speed.

To accomplish the above objects, according to the invention, in a serial-type A/D converter utilizing folding circuit cells, each cell has a differential type input and a differential type output, and the input/output characteristic of the cell is folded by switching current paths in response to a comparison output signal of a comparator which is determined by an input potential difference.

The folding circuit cell includes a load circuit comprised of a serial connection of a resistor and a diode or a transistor to farther improve accuracy.

A serial-type A/D converter utilizing folding circuit cells which are adapted for the A/D conversion into a Gray code can be altered to perform the A/D conversion into a binary code at a high conversion speed by adding exclusive OR circuits connected in cascade, the respective exclusive OR circuits having one input connected to receive a comparison output signal of the respective stage cells and the other input connected to receive a logical output signal of a preceding-stage exclusive OR circuit.

DESCRIPTION OF THE PREFERRED EMBODIMENTS

The invention will now described by way of example with reference to the accompanying drawings.

Figure 1:
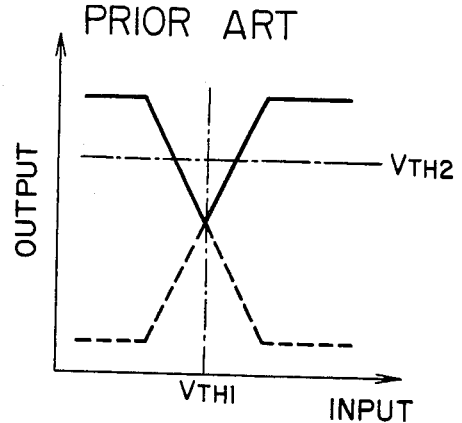
FIG. 1 is a graph showing an input/output characteristic corresponding to a Gray code exhibited by a prior art folding circuit cell.
Figure 2:
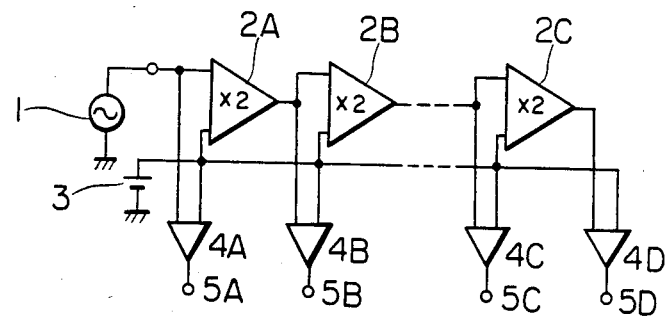
FIG. 2 is a block diagram showing a prior art serial-type A/D converter utilizing folding circuit cells.
Figure 3:
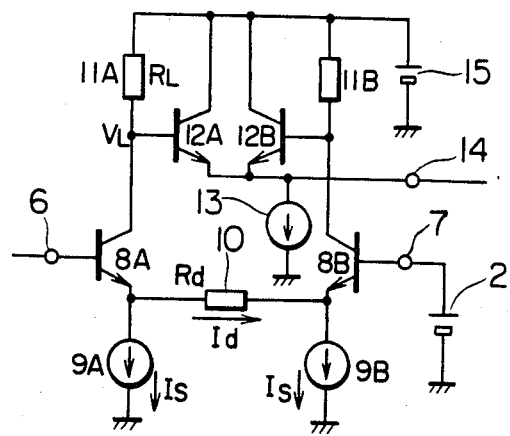
FIG. 3 is a circuit diagram of a prior art folding circuit cell.
Figure 4:
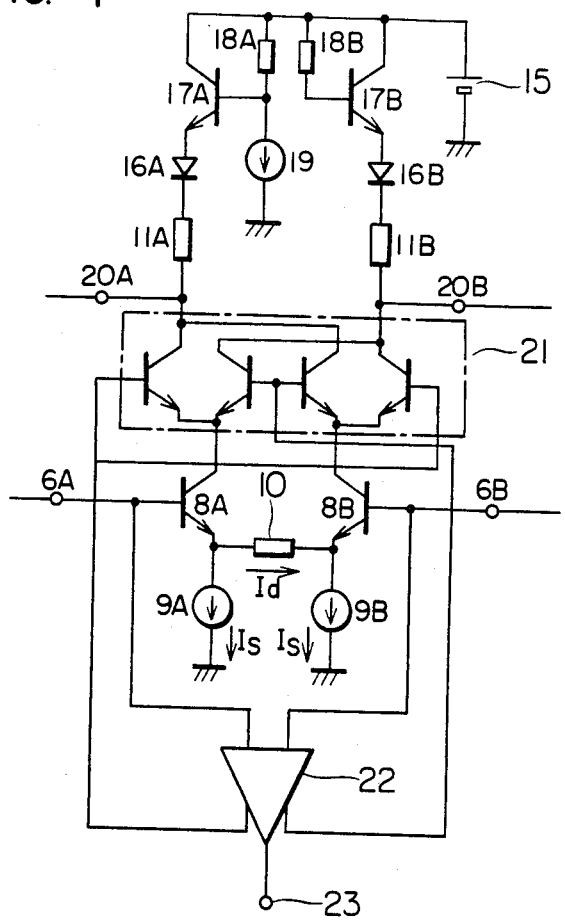
FIG. 4 is a circuit diagram showing an embodiment of a folding circuit cell for the A/D conversion into a Gray code according to the invention.

FIG. 4 shows a preferred embodiment of a folding circuit cell used in a serial-type A/D converter for the A/D conversion into a Gray code. For simplicity of description, elements identical to those in the prior art example of FIG. 3 are designated by identical reference numerals. Referring to FIG. 4, the folding circuit cell comprises differential input terminals 6A and 6B, transistors 8A and 8B constituting a differential circuit, constant current sources 9A and 9B, a resistor 10 connected between the sources 9A and 9B, load resistors 11A and 11B, a power supply 15, diodes 16A and 16B adapted to mitigate non-linearity, transistors 17A and 17B for mitigating non-linearity and for level shifting, resistors 18A and 18B for level shifting, a constant current source 19, differential output terminals 20A and 20B, a current switching circuit 21, a comparator 22, and an output terminal 23 of the comparator 22. The current switch 21 is responsive to output polarities of the comparator 22 to switch over current paths.

Figure 5:
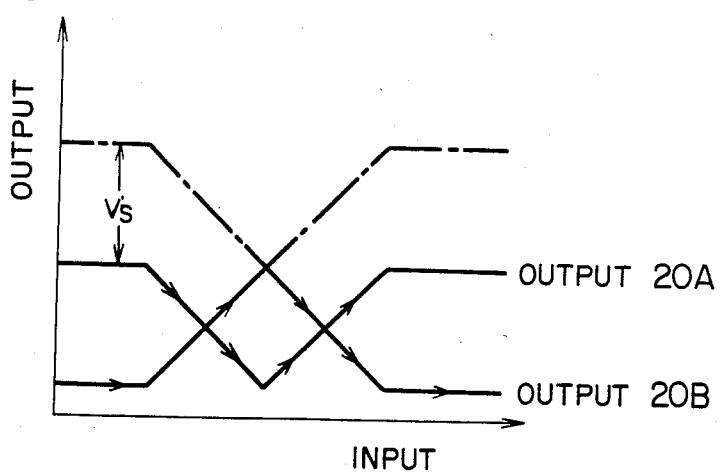
FIG. 5 is a graph showing the input/output characteristics of the folding circuit cell shown in FIG. 4.

This folding circuit cell operates as will be described below. An input voltage is first converted into a current by means of the transistors 8A and 8B. Then, the comparator 22 is operated to switch over the current switching circuit 21 in accordance with the polarity of the input voltage so that folding type output voltages are generated at the output terminals. The relation between the input voltage and the respective output voltages is illustrated in FIG. 5. If the output potential difference starts to change from the lefthand side in FIG. 5, the output voltage 20B increases as the input voltage increases. Subsequently, when the potential difference exceeds zero and the polarity changes, the current switching circuit 21 is switched over and the output voltage at the output terminal 20B stops increasing as would be expected to trace the chained line but conversely decreases to trace a solid line. On the other hand, the current flowing through the load resistor 11A traces a chained line and the output voltage produced across the load resistor 11A undergoes level shifting by a voltage $V_s$ by means of the current source 19 and resistor 18A to provide an output voltage 20A at the output terminal 20A. This output voltage 20A crosses the remaining output voltage 20B at two points as shown in FIG. 5. Consequently, accurate conversion can be effected by setting the level shifting voltage $V_s$ to half the input range. In contrast to the prior art circuit of FIG. 3 having the folding characteristic referenced to the threshold voltage, the folding circuit cell according to this embodiment realizes the folding characteristics by utilizing a pair of output voltages which are in complementary relationship as shown in FIG. 5.

Figure 6:
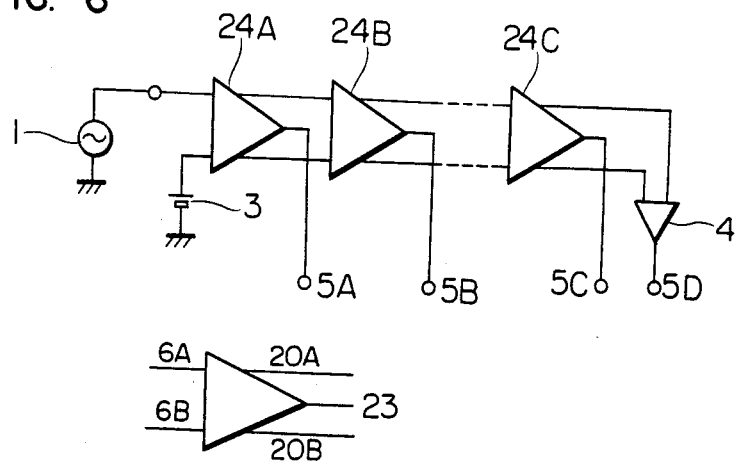
FIG. 6 is a schematic diagram showing a serial-type A/D converter utilizing folding circuit cells embodying the invention.

FIG. 6 shows a first embodiment of a serial-type A/D converter utilizing folding circuit cells each having the above construction. Folding circuit cells 24A, 24B, . . . are connected in cascade in such a manner that the differential output terminals of a preceding stage cell are connected to input terminals 6A and 6B of a succeeding stage cell. The input signal 1 is connected to one input terminal of the initial stage cell 24A and a threshold voltage 3 is connected to the other input terminal. The input signal 1 is sequentially folded by the preceding stage cell and sent to the succeeding stage cell. The comparator included in the respective folding circuit cells compares polarities at respective two input terminals and delivers out a comparison output signal at respective output terminals 5A to 5D. This comparison output signal corresponds to the conversion output signal.

To explain the input/output relation of the folding circuit cell shown in FIG. 4, it is now assumed that the current sources 9A and 9B have a current value $I_s$, the resistor 10 has a resistance $R_d$, the current flowing through the resistor 10 is $I_d$, the load resistors 11A and 11B have a resistance $R_L$, the resistors 18A and 18B have a resistance $R_B$ and all transistors shown in FIG. 4 have a grounded base current amplification factor $\alpha$.

Under this condition, it is also assumed that level shifting by the current source 19 is negligible.

The same relation as defined by the equation (1) is valid for the differential input voltage $V_i$, that is, $$V_i = R_d \cdot I_d + V_T \ln\left(\frac{I_s + I_d}{I_s - I_d}\right) \tag{1}$$

Then, with view to the power supply, the load resistors 11A and 11B respectively assume voltages $V_A$ and $V_B$ as follows:

$$V_A = R_L \cdot (I_s + I_d) \cdot \alpha^2 + 2V_T \ln\left(\frac{I_s + I_d}{I_{E0}}\right) + \tag{6A}$$
$$(1 - \alpha)\alpha^2 R_B (I_s + I_d)$$

$$V_B = R_L \cdot (I_s - I_d) \cdot \alpha^2 + 2V_T \ln\left(\frac{I_s - I_d}{I_{E0}}\right) + \tag{6B}$$
$$(1 - \alpha)\alpha^2 R_B (I_s - I_d)$$

where $I_{E0}$ represents the emitter saturation current, the first, second and third terms of equation (6A) respectively represent voltages across the load resistor 11A, the diode 16A and transistor 17A and the resistor 18A, and the first, second and third terms of equation (6B) respectively represent voltages across the load resistor 11B, the diode 16B and transistor 17B and the resistor 18B. Thus, the voltage difference $V_{\overline{0}}$ between the output terminals 20A and 20B becomes $$V_{\overline{0}} = V_A - V_B = 2\alpha^2 I_d \{R_L + (1 - \alpha)R_B\} + \tag{7}$$
$$2V_T \ln\left(\frac{I_s + I_d}{I_s - I_d}\right)$$

and the gain K is written by $$K = 2 \cdot \frac{\alpha^2 \{R_L + (1 - \alpha)R_B\} \cdot I_d + V_T \ln\left(\frac{I_s + I_d}{I_s - I_d}\right)}{R_d \cdot I_d + V_T \ln\left(\frac{I_s + I_d}{I_s - I_d}\right)} \tag{8}$$

Therefore, the gain can become exactly 2 throughout the entire range of the operating current by setting the individual constants to value which satisfy $$R_d = \alpha^2 \{R_L + (1-\alpha)R_B\} \tag{9}$$

This condition is reduced to $$R_d = R_L \text{ and } R_B = 2R_L \tag{10}$$

since $\alpha$ approximates 1 (one), and when equation (10) is met, the gain can be set to 2 with sufficiently high accuracy.

In the serial-type A/D converter utilizing the folding circuit cells, each cell is required to have a gain of 2. If this condition is unsatisfied, linearity will be degraded. Therefore it contributes to the great advantage of the invention that the gain of the folding circuit cell according to the present embodiment can be set to 2 with sufficiently high accuracy.

Further, in this embodiment, the current switching circuit 21 is operated by the comparator 22 to switch over the collector current paths for the transistors 8A and 8B, thereby establishing the folding characteristic. Therefore, the present embodiment is also advantageous in that the error occurring at the folding point with the prior art cell can be reduced sufficiently by making the sensitivity of the comparator 22 sufficiently high.

As described above, according to the present embodiment, the serial-type A/D converter is constituted by such folding circuit cells as shown in FIG. 4. Consequently, non-linearity resulting from the diode voltage in the prior art example can be eliminated completely to realize linearity throughout the entire range of operating current, thereby making it possible to provide a highly accurate A/D converter which is of good voltage utilization efficiency and low power consumption. Further, since it is easy to match the resistor 10 to the resistors 11A and 11B by making their resistances equal and since the cell is immune to variation in the current amplification factor $\alpha$ of the transistors, this folding circuit cell is advantageous for production as an integrated circuit. Moreover, thanks to the differential type, the cell has a significant advantage that it is immune to variations in the power supply voltage and operating temperature as well as to the influence of noise. In addition, the cell according to this embodiment employs the current switching circuit 21 and the comparator 22 to establish the folding characteristic without resort to paired transistors having emitters connected in common according to the prior art example, thereby preventing the generation of non-linear error due to dependency of the base/emitter voltage of the paired transistors upon current.

Figure 7:
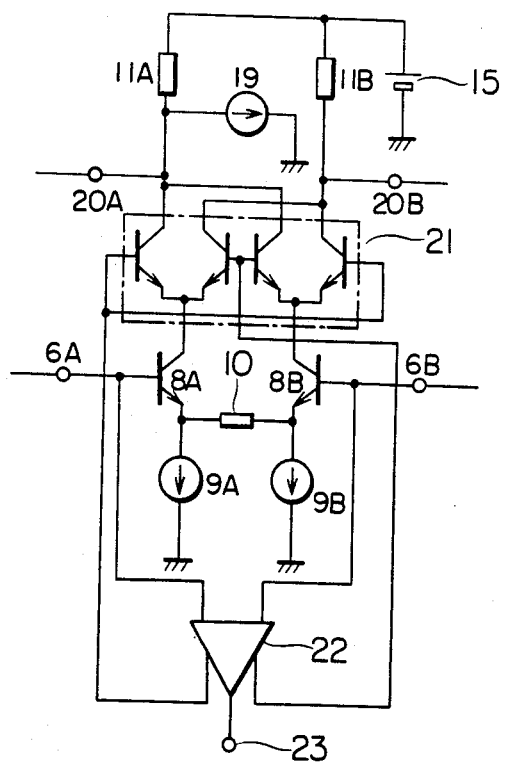
FIG. 7 is a circuit diagram showing another embodiment of a folding circuit cell with a simplified load circuit for the A/D conversion into a Gray code according to the invention.

The present invention operates properly even when the load circuit in the folding circuit cell according to the first embodiment of the invention is simplified. For example, a folding circuit cell as shown in FIG. 7 is conceivable. In this embodiment, the load circuit is constituted by only resistors 11A and 11B, and voltage shifting is effected by the resistor 11A and a current source 19. When compared to the folding circuit cell of FIG. 4, the cell of this embodiment is susceptible to the generation of non-linearities due to the diode voltage and in addition, is sensitive to variations in the current amplification factor $\alpha$ of the transistor. For these reasons, the cell of this embodiment has less accuracy than the FIG. 4 cell but is advantageous over the cell of FIG. 4 in that it can operate at a lower voltage. Further, the cell of FIG. 7 can also prevent generation of a conversion error at the folding point, thus having higher accuracy than the prior art cell shown in FIG. 3.

Figure 8:
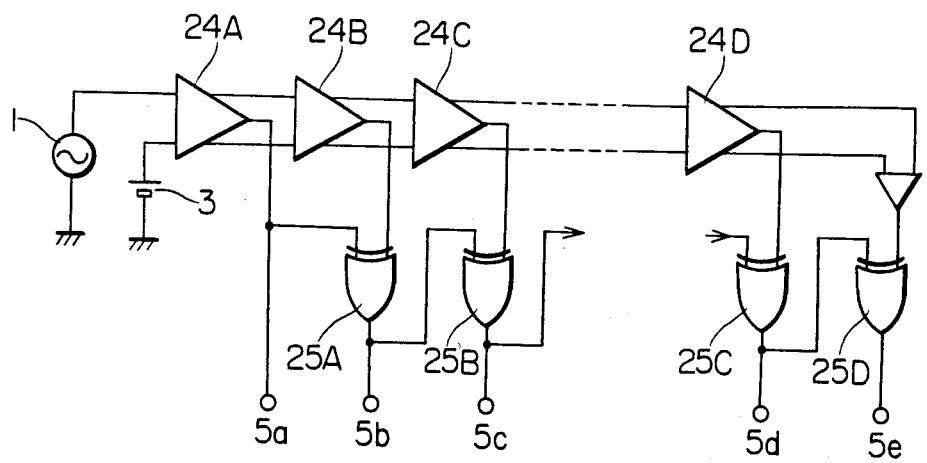
FIG. 8 is a schematic diagram of a serial-type A/D converter embodying the invention which is adapted for the A/D conversion into a binary code by utilizing folding circuit cells connected in cascade for the A/D conversion into a Gray code and exclusive OR circuits also connected in cascade.

Referring now to FIG. 8, a second embodiment of a serial-type A/D converter will be described. The A/D converter according to the first embodiment shown in FIG. 6 provides the output code of a Gray code format. But the output code of a binary code format is easy to use. Then, the second embodiment of a serial-type A/D converter shown in FIG. 8 is adapted for the A/D conversion into a binary code output by utilizing exclusive OR circuits. The essential part of the FIG. 8 embodiment is the same as that of the first embodiment of FIG. 6. Specifically, in the second embodiment, exclusive OR circuits 25A, 25B, ..., 25D are connected in cascade such that the respective exclusive OR circuits have one input connected to receive a comparison output signal of the respective stages of folding circuit cells and the other input connected to receive a logical output signal of a preceding-stage exclusive OR circuit. In FIG. 8, 5a to 5e denote converted binary code output terminals.

Generally, a converter for the conversion of a Gray code to a binary code by utilizing exclusive OR logical sum includes exclusive OR circuits connected in cascade and the converted output signal suffers delay in the generation of the first bit (MSB) and the successive following bits by a signal delay time in each exclusive OR circuit. As a result, the conversion time tends to be retarded and the conversion efficiency is degraded. According to the FIG. 8 embodiment of the serial-type A/D converter, however, the exclusive OR circuits in cascade connection are advantageously combined with the folding circuit cells also connected in cascade, whereby the serial output signals from the respective folding circuit cells 24A to 24D are delayed by a signal delay time in each cell in contrast to parallel output signals generated from a parallel-type A/D converter, for example, so that the generation of the output signals from the folding circuit cells 24A to 24D shifts in the same direction as the generation of the output signals from the exclusive OR circuits 25A to 25D does to cancel out the signal delays in both the folding circuit cells and exclusive OR circuits and as a result, the ultimate conversion delay can be reduced to the order of a delay in one stage of the exclusive OR circuit. In other words, by using the combination of the serial stages of folding circuit cells and the serial stages of exclusive OR circuits, the problem of delayed conversion otherwise accompanying by the ordinary code converter can substantially be eliminated.

As described above, the serial-type A/D converter of the first embodiment adapted for the A/D conversion into a Gray code is altered to the second embodiment adapted for the A/D conversion into a binary code by adding the exclusive OR circuits. In an alternative, however, the folding circuit cell per se may be adapted for the A/D conversion into a binary code. Such a modification is surely simplified in its construction but is inferior to the combination of the serial stages of the cells and serial stages of the exclusive OR circuits according to the second embodiment of the A/D converter in that the conversion error is liable to occur.

Figure 9A:
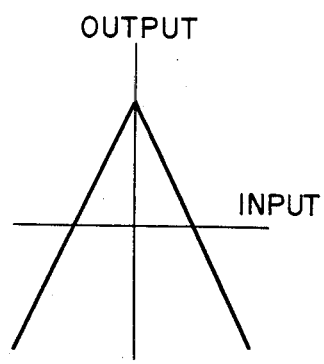
FIG. 9a is a graph showing an input/output characteristic of the folding circuit cell for the A/D conversion into a Gray code.
Figure 9B:
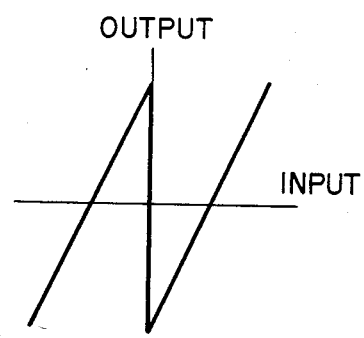
FIG. 9b is a graph showing an input/output characteristic of the folding circuit cell for the A/D conversion into a binary code.

To discuss the tendency to generate the conversion error with a folding circuit cell dedicated to the A/D conversion to a binary code, reference should be made to FIGS. 9a and 9b respectively showing the input/output characteristics of folding circuit cells respectively adapted for the A/D conversion into a Gray code and a binary code.

In the input/output characteristic of FIG. 9a corresponding to the Gran code, a discontinuity does not take place at the folding point whereas in the input/output characteristic of FIG. 9b corresponding to the binary code, discontinuity takes place at the folding point. Therefore, in the event the input voltage contains noise, the output voltage will not vary greatly at the folding point in accordance with the former characteristic corresponding to the Gray code, but it will vary greatly in accordance with the latter characteristic corresponding to the binary code, resulting in extremely unstable conversion and tendency to generate a large conversion error.

For the reasons described above, the second embodiment of the A/D converter according to the present invention can provide the advantageous serial-type A/D converter by combining the folding circuit cells adapted for the A/D conversion into the Gray code and inherently having less tendency to generate the conversion error with the code converter of an easy-to-use code formate comprising the exclusive OR circuits connected in cascade.

Figure 10:
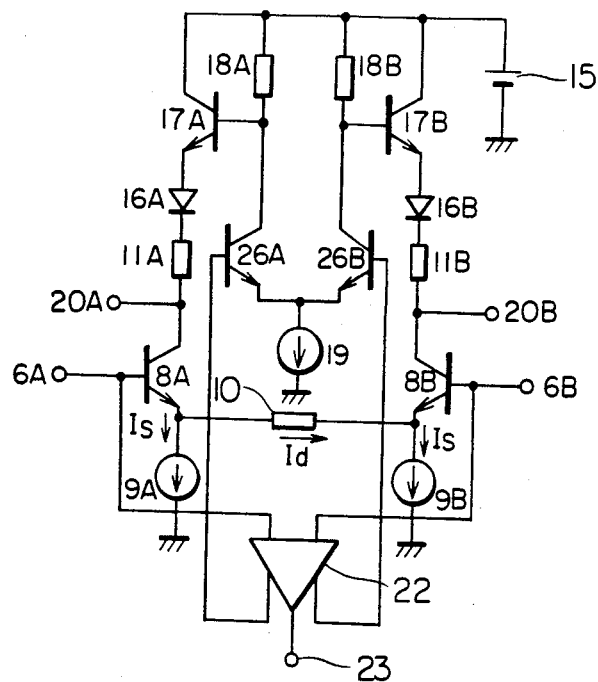
FIG. 10 is a circuit diagram showing an embodiment of a folding circuit cell for the A/D conversion into a binary code according to the invention.

FIG. 10 shows a third embodiment of a folding circuit cell according to the invention. The cell of FIG. 10 has almost the same construction as that of the FIG. 4 cell. In contrast to the FIG. 4 cell wherein the current switching circuit 21 is switched by the comparator 22 to switch over the collector current paths for the paired transistors 8A and 8B so as to establish the folding characteristic corresponding to the Gray code shown in FIG. 5, the FIG. 10 cell is such that a comparator 22 switches over a current switching circuit comprising a pair of transistors 26A and 26B so as to switch over the current path for a current source 19 whereby a voltage shifting circuit comprised of resistors 18A and 18B and the current source 19 and a voltage shifting circuit comprised of a resistor 18B and the current source 19 are alternately operated to establish a folding characteristic corresponding to a binary code.

Figure 11:
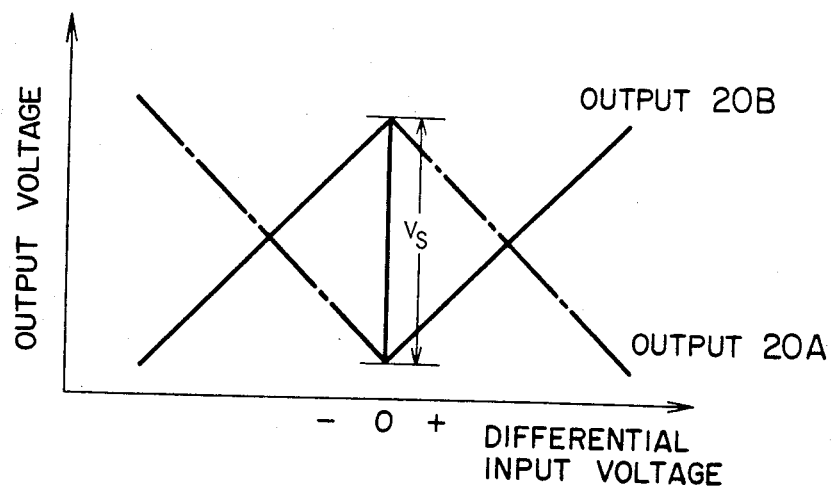
FIG. 11 is a graph showing the input/output characteristics of the folding circuit cell shown in FIG. 10.

FIG. 11 is a graphical representation the input/output characteristics of the folding circuit cell shown in FIG. 10. By referring to the characteristics of FIG. 11, the operation of the FIG. 10 cell will be described.

Like the FIG. 4 cell according to the first embodiment of the folding circuit cell of the invention, the FIG. 10 cell has a differential type input and a differential type output. When the output voltage, that is, the voltage difference between input terminals 6A and 6B is negative and is shifting to positive in FIG. 11, the transistor 26A is turned on and the transistor 26B is turned off in the current switching circuit with the result that current in the current source 19 is drawn through the resistor 18A to shift the output voltage at one output terminal 20A to a lower level. Consequently, as the input voltage increases, the output voltage at the one output terminal 20A decreases as shown by the chained line and the output voltage at the other output terminal 20B increases as shown by the solid line, providing a crossing in the negative region of the input voltage.

As the input voltage further increases to slightly exceed the zero point of the input voltage, the output signal polarity of the comparator 22 changes to switch over the current switching circuit with the result that the current in the current source 19 is drawn through the resistor 18B to shift the output voltage at the other output terminal 20B to a lower level. Consequently, the output voltages at both the output terminals change by a shifting voltage $V_s$ determined by the current source 19 and the resistors 18A and 18B. Thus, as the input voltage further increases, a crossing is provided in the positive region of the input voltage to establish a folding characteristic corresponding to a binary code format.

When denoting, in the FIG. 10 cell, currents in current sources 9A and 9B by $I_s$, the resistance of the resistor 10 by $R_d$, current flowing through the resistor 10 by $I_d$, the resistances of load resistors 11A and 11B by $R_L$, and the resistances of the resistors 18A and 18B by $R_B$, the same relation as defined by the equation (1) is valid for the differential input voltage $V_i$, that is, $$V_i = R_d \cdot I_d + V_T \ln\left(\frac{I_s + I_d}{I_s - I_d}\right) \tag{1}$$

Since the principle of linear superposition is applicable to the output level shifting due to the current source 19, the output voltages $V_{20A}$ and $V_{20B}$ with respect to the power supply can be expressed by the following equations when the current in the current source 19 is assumed to be zero.

$$V_{20A} = R_L \cdot (I_s + I_d) \cdot \alpha + 2V_T \ln\left(\frac{I_s + I_d}{I_{E0}}\right) + \tag{11A}$$
$$(1 - \alpha)\alpha \cdot R_B(I_s + I_d)$$

$$V_{20B} = R_L \cdot (I_s - I_d) \cdot \alpha + 2V_T \ln\left(\frac{I_s - I_d}{I_{E0}}\right) + \tag{11B}$$
$$(1 - \alpha)\alpha \cdot R_B(I_s - I_d)$$

where $I_{E0}$ is the emitter saturation current, and $\alpha$ is the grounded base current amplification factor. Therefore, the differential output voltage $V_o$ is given by $$V_o = V_A - V_B = 2R_L \cdot I_d \cdot \alpha + 2V_T \ln\left(\frac{I_s + I_d}{I_s - I_d}\right) + \tag{12}$$
$$2(1 - \alpha)\alpha \cdot R_B \cdot I_d$$

and there results the gain K which is $$K = \frac{V_o}{V_i} = \tag{13}$$

$$2\frac{I_d \cdot \alpha\{R_L + (1 - \alpha)R_B\} + V_T \ln\left(\frac{I_s + I_d}{I_s - I_d}\right)}{R_d \cdot I_d + V_T \ln\left(\frac{I_s + I_d}{I_s - I_d}\right)}.$$

Then, by so determining the constants as to satisfy $$R_d = \alpha\{R_L + (1-\alpha)R_B\} \tag{14}$$

the gain K as expressed by equation (13) becomes 2 irrespective of the operating current and input voltage, ensuring highly accurate conversion. The equation (14) is satisfied when $R_d = R_L$ stands for $\alpha$ approaching 1(one). But under the condition that $\alpha < 1$, the equation (14) is valid with an error of the order of $(1-\alpha)^2$ on the assumption that $R_d = R_L = R_B$, that is, an error of the order of 1/10000 for ordinary transistors having a current amplification factor $\alpha$ which is 0.99.

Such a condition which is satisfied with the equality of all the resistances is preferable for improving accuracy of the circuit, thus making it possible to obtain the ideal gain of 2 with ease.

In the circuit cell of FIG. 10, the resistors 18A and 18B compensate for deviation of the current amplification factor $\alpha$ of the transistor from 1(one) as will be seen from equation (14) and at the same time effect level shifting of the output voltage. In addition, the transistors 17A and 17B constitute an emitter follower circuit for transmission of the level shifting voltage to the output terminals and provide diode voltages which compensate for non-linearity due to changes in the base/emitter diode voltages of the transistors 8A and 8B. In this manner, a simplified and efficient cell can be obtained in accordance with the third embodiment of FIG. 10.

As will be appreciated from the foregoing description, the third embodiment of FIG. 10 attains the same advantages as the first embodiment of FIG. 4 including good linearity throughout the entire range of operating current and consequent immunity from the influence of current amplification factor $\alpha$ of the transistor, advantageous production in the form of an integrated circuit thanks to the formation of all the resistors of identical resistance, and immunity, thanks to the differential type input and output, from variations in the power supply voltage and operating temperature as well as to the influence of noise.

Figure 12:
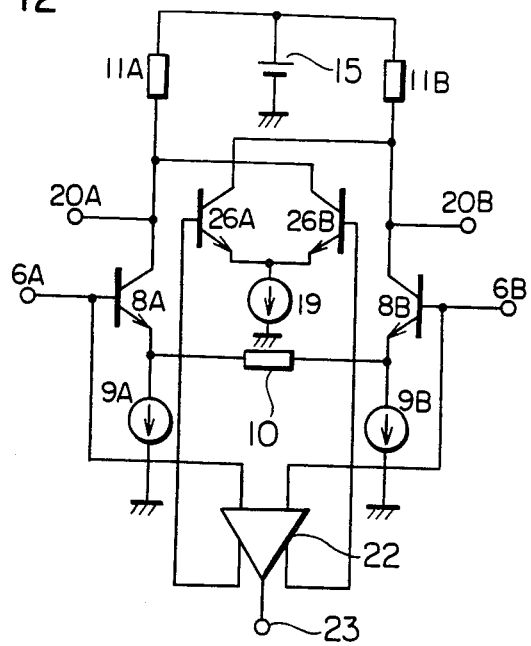
FIG. 12 is a circuit diagram showing another embodiment of a folding circuit cell with a simplified load circuit for the A/D conversion into a binary code according to the invention.

The present invention also includes a simplified version of the folding circuit cell of the third embodiment. For example, a folding circuit cell as shown in FIG. 12 is conceivable. The load circuit is constituted by only resistors 11A and 11B through which current in a current source 19 is drawn to provide the function of voltage shifting.

Because of the non-linearity of the diode voltage and the current amplification factor $\alpha$ of the transistor being unequal to 1(one), the FIG. 12 cell is inferior to the FIG. 10 cell in accuracy but thanks to the differential type operation, it is immune to variations in the power supply voltage and operating temperature as well as to the influence of noise. In addition, the FIG. 12 cell, without diodes in the load circuit, can operate at a lower voltage than the FIG. 10 cell.

Figure 13:
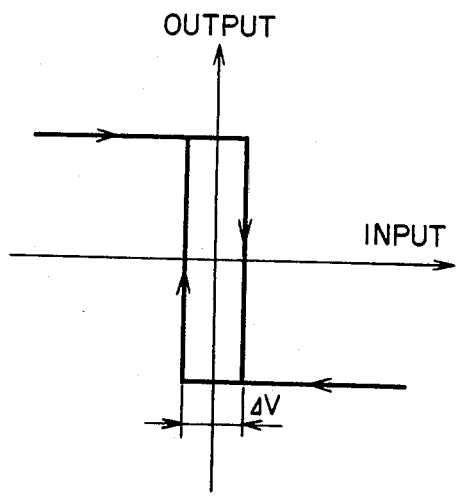
FIG. 13 is a graph showing an input/output characteristic of a comparator circuit with a hysteresis characteristic.

The folding circuit cell of FIG. 10 for the A/D conversion into the binary code is susceptible to unstable operation owing to a discontinuity at the folding point for the reasons described previously. To cope with this disadvantage, the comparator 22 preferably has an input/output characteristic in the form of a hysteresis characteristic as shown in FIG. 13. Typically, the input hysteresis voltage $\Delta V$ is set to approximate an input voltage which provides a minimum resolution of the A/D converter utilizing the folding circuit cells.

Figure 14:
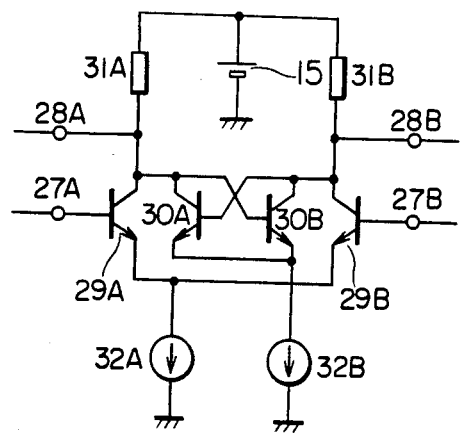
FIG. 14 is a circuit diagram of a comparator circuit exhibiting the hysteresis characteristic shown in FIG. 3.

Specifically, a comparator as exemplified in FIG. 14 is employed to obtain the hysteresis characteristic. Referring to FIG. 14, the comparator comprises a pair of input terminals 27A and 27B, output terminals 28A and 28B, a pair of transistors 29A and 29B constituting a differential amplifier, a pair of transistors 30A and 30B constituting a positive feedback circuit, a pair of load resistors 31A and 31B, and operating current sources 32A and 32B.

When the amount of current in the operating current source 32B is zero, this comparator operates as an ordinary differential amplifier. But, as the amount of this current increases, the sensitivity of the comparator increases near the zero point of the input voltage. Where the resistors 31A and 31B have a resistance of $R_L$, the operating current source 32B passes a current of $I_L$, and the transistors have a thermal voltage of $V_T$, hysteresis occurs under the following condition:

$$I_L \cdot R_L \geq 2V_T \quad (15)$$

In this manner, the comparator shown in FIG. 14 exhibits the hysteresis characteristic by having the resistance of the load resistors 31A and 31B and the current of the operating current source 32B set to suitable values, to ensure that the unstable characteristic near the folding point of the folding circuit cell, as mentioned previously, can be suppressed.

In the foregoing description, the current switching circuit is constituted by bipolar transistors but it may obviously be constituted by field effect transistors. Further, the folding circuit cells shown in FIGS. 4, 7, 10 and 12 may be provided with buffer means including emitter follower circuits connected to the output terminals 20A and 20B and level shifting means including diodes connected in series with the emitters of transistors of the emitter follower circuits, if so desired by design. The provision of such means, however, is not essential to the present invention.

As has been described, according to the present invention, in the serial-type A/D converter utilizing folding circuit cells, the cell has a differential type input and output to make it immune to variations in the power supply voltage and operating temperature as well as to the influence of noises, and its gain can be set to the ideal value of 2 by making equal resistances of the resistors of the cell. The load circuit has the series connection of the resistor, the diode and the transistor arranged to exhibit the diode characteristic to attain the advantages that non-linearity of the voltage/current converter comprised of the paired transistors can be corrected to obtain linearity throughout substantially the entire range of operating current, and that degradation of gain setting accuracy due to the fact that the grounded base current amplification factor $\alpha$ of the transistor is not 1(one) can be prevented by connecting a resistor to the base of the transistor arranged to exhibit the diode characteristic. In addition, according to the invention, the current switching circuit is switched by means of the comparator to switch over the current path so as to establish the folding characteristic. Accordingly, accuracy of the A/D conversion can be improved by the order of 3 bits as compared to the prior art A/D converter and hence an A/D converter having resolution of about 8 to 9 bits can be materialized.

The A/D converter according to the invention can be adapted for the A/D conversion either into the Gray code format or the binary code format. In particular, the A/D converter utilizing folding circuit cells having folding characteristics corresponding to the Gray code format can be combined with the exclusive OR circuits connected in cascade so as to be altered to the A/D converter adapted for the binary code format which can provide an easy-to-use binary code output without causing an appreciable delay in code conversion time. The folding circuit cell dedicated to the A/D conversion into the binary code has the comparator which can exhibit the hysteresis characteristic, thereby making it possible to stabilize the A/D conversion into the binary code which is liable to be unstable.

As will be appreciated from the foregoing description, the present invention can materialize a highly accurate, stably operable and easy-to-use serial-type A/D converter which can be fabricated easily.

We claim:

1. A serial-type A/D converter utilizing folding circuit cells connected in cascade wherein each cell has an input terminal and an output terminal, the output terminal of a preceding stage cell being connected to the input terminal of a succeeding stage cell, each of said cells comprising:
   differential circuit means having a pair of input terminals, for converting a differential input voltage between said paired input terminals into a differential output current;
   load circuit means for converting said differential output current into paired differential output voltages;
   comparator means responsive to the polarity of the potential difference between said paired input terminals, said comparator means producing a digital output corresponding to said potential difference;
   current switching circuit means connected between said differential circuit means and said load circuit means responsive to the digital output of said comparator means for alternately switching current paths for said differential output current; and
   level shifting circuit means for providing output signals at said output terminals by shifting one of said paired differential output voltages.

2. A serial-type A/D converter utilizing folding circuit cells connected in cascade wherein each cell has an input terminal and an output terminal, the output terminal of a preceding stage cell being connected to the input terminal of a succeeding stage cell, each of said cells comprising:
   differential circuit means having a pair of input terminals, for converting a differential input voltage between said paired input terminals into a differential output current;
   load circuit means for converting said differential output current into paired differential output voltages;
   comparator means responsive to the polarity of the potential difference between said paired input terminals, said comparator means producing a digital output corresponding to said potential difference;
   level shifting circuit means responsive to said compared output, said level shifting means providing output signals at said paired output terminals by effecting alternate level shifting of said paired differential output voltages.

3. A serial-type A/D converter according to claim 1 further comprising a plurality of exclusive OR circuits connected in cascade and sequentially providing a converted digital output, said respective exclusive OR circuits having one input connected to receive said digital output from said comparator means of the respective cells and the other input connected to receive said digital output from an adjacent exclusive OR circuit corresponding to an upper bit.

4. A serial-type A/D converter according to claim 1 wherein said differential circuit means comprises a pair of transistors having the bases thereof connected to said paired differential input terminals and a resistor connected between the emitters of said paired transistors, and wherein said load circuit means comprises a pair of series connections each including a resistor, a diode and a transistor arranged to exhibit a forward diode voltage which are connected in series.

5. A serial-type A/D converter according to claim 2 wherein said differential circuit means comprises a pair of transistors having the bases connected to said paired differential input terminals and a resistor connected between the emitters of said paired transistors, and wherein said load circuit means comprises a pair of series connections each including a resistor, a diode and a transistor arranged to exhibit a forward diode voltage which are connected in series.

6. A serial-type A/D converter according to claim 4 further comprising a resistor connected to the base of said transistor in each of said paired series connections.

7. A serial-type A/D converter according to claim 5 further comprising a resistor connected to the base of said transistor in each of said paired series connections.

8. A serial-type A/D converter according to claim 4 further comprising a resistor connected to the base of said transistor in each of said paired series connections, and a current source connected to the base of one of said transistors in said paired series connections.

9. A serial-type A/D converter according to claim 2 wherein said level shifting circuit means comprises a resistor connected to the base of said transistor in each of said paired series connections and current switching circuit connected to the base of said transistor in each of said paired series connections responsive to said compared output.

10. A serial-type A/D converter according to claim 1 wherein said comparator means has hysteresis in its input/output characteristic.

11. A serial-type A/D converter according to claim 2 wherein said comparator means having the hysteresis characteristic comprises a pair of transistors connected to form a positive feedback circuit.

12. A serial-type A/D converter according to claim 10 wherein said comparator means having the hysteresis characteristic comprises a pair of transistors connected to form a positive feedback circuit.

13. A serial-type A/D converter according to claim 11 wherein said comparator means having the hysteresis characteristic comprises a pair of transistors connected to form a positive feedback circuit.

* * * * *